(12) United States Patent
Carothers

(10) Patent No.: US 7,772,038 B2
(45) Date of Patent: Aug. 10, 2010

(54) CMOS PROCESS FOR FABRICATION OF ULTRA SMALL OR NON STANDARD SIZE OR SHAPE SEMICONDUCTOR DIE

(75) Inventor: Daniel Carothers, Milford, NH (US)

(73) Assignee: Retro Reflective Optics, LLC, Peterborough, NH (US)

( * ) Notice: Subject to any disclaimer, the term of this patent is extended or adjusted under 35 U.S.C. 154(b) by 281 days.

(21) Appl. No.: 11/919,046

(22) PCT Filed: Jun. 23, 2006

(86) PCT No.: PCT/US2006/024630
§ 371 (c)(1),
(2), (4) Date: Oct. 22, 2007

(87) PCT Pub. No.: WO2007/040688
PCT Pub. Date: Apr. 12, 2007

(65) Prior Publication Data
US 2009/0298231 A1 Dec. 3, 2009

Related U.S. Application Data

(60) Provisional application No. 60/722,309, filed on Sep. 30, 2005.

(51) Int. Cl.
*H01L 21/00* (2006.01)
*H01L 21/302* (2006.01)
*H01L 21/461* (2006.01)

(52) U.S. Cl. ............... 438/114; 438/113; 438/743; 438/744

(58) Field of Classification Search .......... 438/33, 438/68, 106–127, 460, 464, 465, 743, 744, 438/756, 757
See application file for complete search history.

(56) References Cited

U.S. PATENT DOCUMENTS

| | | | |
|---|---|---|---|
| 5,424,254 A * | 6/1995 | Damiot ............... | 438/106 |
| 6,562,648 B1 * | 5/2003 | Wong et al. ........... | 438/46 |
| 6,756,288 B1 * | 6/2004 | Feil et al. ............ | 438/464 |
| 2004/0038448 A1 * | 2/2004 | Seo et al. ............ | 438/106 |
| 2004/0087059 A1 * | 5/2004 | Ruby et al. .......... | 438/113 |
| 2005/0048740 A1 * | 3/2005 | Noma et al. ......... | 438/460 |

* cited by examiner

*Primary Examiner*—Ha Tran T Nguyen
*Assistant Examiner*—Karen M Kusumakar

(57) ABSTRACT

A method for the singulation of integrated circuit die, the method including: etching a semiconductor layer disposed on a silicon oxide dielectric layer, thereby forming a trench defining a boundary of the die; depositing a silicon nitride layer in the trench; coating the semiconductor layer with an oxide layer such that the trench is filled; removing part of the oxide layer from the semiconductor layer such that the oxide layer only remains in the trench; mounting the semiconductor layer to a carrier; removing the silicon oxide dialectic layer, the nitride layer, and the oxide layer; and releasing the die from the carrier. The method is suitable for irregularly shaped or extremely small die and is compatible with traditional CMOS processes.

18 Claims, 14 Drawing Sheets

US 7,772,038 B2

CMOS PROCESS FOR FABRICATION OF ULTRA SMALL OR NON STANDARD SIZE OR SHAPE SEMICONDUCTOR DIE

RELATED APPLICATIONS

This application claims the benefit of U.S. Provisional Applications No. 60/722,309, filed Sep. 30, 2005. Each of these applications is herein incorporated in its entirety by reference.

FIELD OF THE INVENTION

This invention relates to the separation of individual integrated circuit die from a larger wafer and in particular to the method and apparatus for accomplishing this with ultra-small and non-standard die sizes and shapes that are not amenable to standard methods.

BACKGROUND OF THE INVENTION

Conventionally, integrated circuit wafers range from 100 to 300 millimeters in diameter and are cut (or diced) into individual die using sawing or "scribe and crack" methods. This process is also sometimes called singulation. These methods typically require a minimum 25 micro-meter kerf or spacing between the die. They are also subject to chipping which often adds 10 to 100 micro-meters to this dimension. In addition the technology used for mounting the wafer to the separation tool will not allow the fabrication of ultra small die as they tend to release prematurely. These dicing technologies are generally limited to straight line cuts. Furthermore with large wafers and small die, more cuts are required making the dicing time prohibitive or at least more costly. In addition, if the die dimension is close to that of the kerf, a large fraction of the wafer is wasted.

What is needed is a rapid, cost effective method that allows very small die or irregularly shaped die to be singulated from a large wafer using a method that is compatible with existing semiconductor foundry practice.

SUMMARY OF THE INVENTION

One embodiment of the present invention provides a method for the singulation of integrated circuit die, the method including: etching a semiconductor layer disposed on a silicon oxide dielectric layer, thereby forming a trench defining a boundary of the die; depositing a silicon nitride layer in the trench; coating the semiconductor layer with an oxide layer such that the trench is filled; removing part of the oxide layer from the semiconductor layer such that the oxide layer only remains in the trench; mounting the semiconductor layer to a carrier; removing the silicon oxide dialectic layer, the nitride layer, and the oxide layer; and releasing the die from the carrier.

Another embodiment of the present invention provides such a method wherein the semiconductor layer comprises a complementary metal-oxide semiconductor circuit.

A further embodiment of the present invention provides such a method wherein the oxide layer comprises silicon oxide.

Yet another embodiment of the present invention provides such a method wherein the removing the silicon oxide dialectic layer, the nitride layer, and the oxide layer includes: selective wet etching of the silicon nitride layer; etching the oxide layer.

A yet further embodiment of the present invention provides such a method wherein the etching the oxide layer comprises etching by a technique of etching selected by from the group of techniques consisting of wet etching and plasma etching.

A yet even further embodiment of the present invention provides such a method wherein a plurality of trenches are formed in the substrate.

Even another embodiment of the present invention provides such a method further including bonding a second circuit to the semiconductor layer.

An even further embodiment of the present invention provides such a method wherein the bonding comprises: applying metallic pads to the semiconductor layer; coupling the metallic pads to the second circuit.

Still another embodiment of the present invention provides such a method wherein the releasing of the dies from the carrier comprises a solvent release.

A still further embodiment of the present invention provides such a method wherein the trench is non-linear.

Even still another embodiment of the present invention provides such a method wherein the die is of a non-standard shape.

One embodiment of the present invention provides a method for the manufacture of a semiconductor die, the method including: fabricating a first semiconductor device on a wafer, the wafer being disposed on a silicon oxide dielectric layer; etching the wafer, thereby forming a trench defining a boundary of the die; depositing a silicon nitride layer in the trench; coating the semiconductor layer with an oxide layer such that the trench is filled; removing part of the oxide layer from the wafer such that the oxide layer remains only in the trench; mounting the wafer to a carrier; removing the silicon oxide dialectic layer, the nitride layer, and the oxide layer; and releasing the die from the carrier.

Another embodiment of the present invention provides such a method wherein the releasing the die from the carrier further comprises using solvents to release the die.

A further embodiment of the present invention provides such a method wherein the step of removing the silicon oxide dialectic layer, the nitride layer, and the oxide layer, further including plasma etching the oxide layer.

Yet another embodiment of the present invention provides such a method wherein the step of removing the silicon oxide dialectic layer, the nitride layer, and the oxide layer, further including wet etching the nitride layer.

A yet further embodiment of the present invention provides such a method wherein the step of removing the silicon oxide dialectic layer, the nitride layer, and the oxide layer, further comprises back grinding and wet etching of the silicon oxide dielectric layer.

Even another embodiment of the present invention provides such a method wherein the carrier is of a carrier material selected from the group of fabric materials consisting of sapphire, silicon, anodized aluminum, and silicon carbide.

An even further embodiment of the present invention provides such a method wherein the trench is non-linear.

One embodiment of the present invention provides a semiconductor die, the die being constructed by the process including: fabricating a first semiconductor device on a wafer, the wafer being disposed on a silicon oxide dielectric layer; etching the wafer, thereby forming a non-linear trench defining a boundary of the die; depositing a silicon nitride layer in the trench; coating the semiconductor layer with an oxide layer such that the trench is filled; removing part of the oxide layer from the wafer such that the oxide layer remains only in the trench; mounting the wafer to a carrier; removing the silicon oxide dialectic layer, the nitride layer, and the oxide layer; and releasing the die from the carrier.

Another embodiment of the present invention provides such a semiconductor die wherein the process further including solvent processing and bulk drying of the die.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

The following Figures illustrate the processing steps of the invention. For clarity, the vertical dimensions are greatly exaggerated. Although only one die is shown, it is to be understood that in the actual process there are generally a large number of similar die disposed across the wafer that are abutting the individual die depicted.

In addition, not shown are the conventional integrated circuit steps of applying photoresist, exposing the photoresist using a reticle and light to define the desired structures and removing the photoresist to open surfaces for further deposition.

Figure 1:
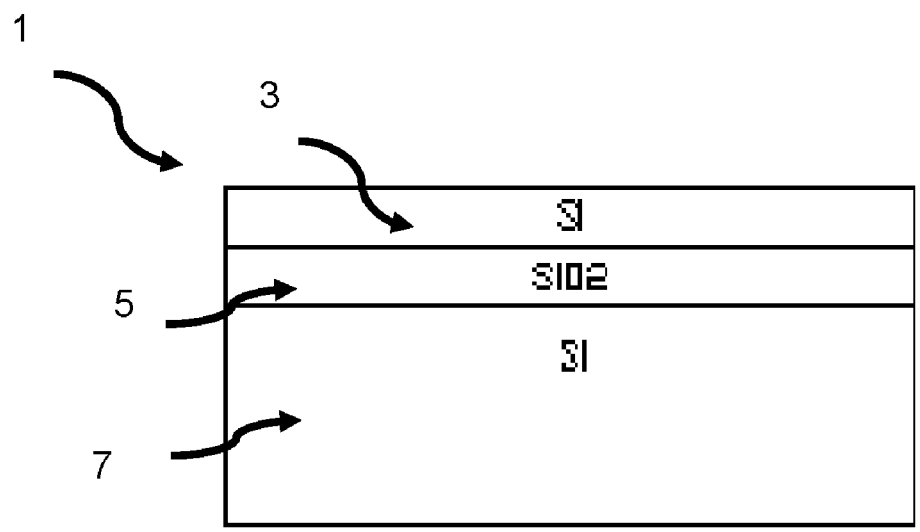
FIG. 1 is a block diagram illustrating a silicon, oxide, insulator wafer to be processed in accordance with one embodiment of the present invention.

Referring to FIG. 1, Silicon on Insulator (SOI) wafer 1 starts with a top silicon layer 3 of sufficient thickness to facilitate adequate performance of the circuitry. Generally, layer 3 thickness greater or equal to 3 micro-meters is adequate. This layer also provides mechanical support for a non-standard shaped die, where as much as 25 to 50 micro-meters of silicon may be required. Semiconductor layer 3 overlies a 200 to 500 nano-meters thick silicon oxide dielectric insulator layer 5 which overlies the bulk silicon 7 of the wafer, which is typically 0.4 millimeters thick. Examples of non-standard shaped dies include dies with round or oval geometries, with irregular shapes, or internal cut outs.

Figure 2:
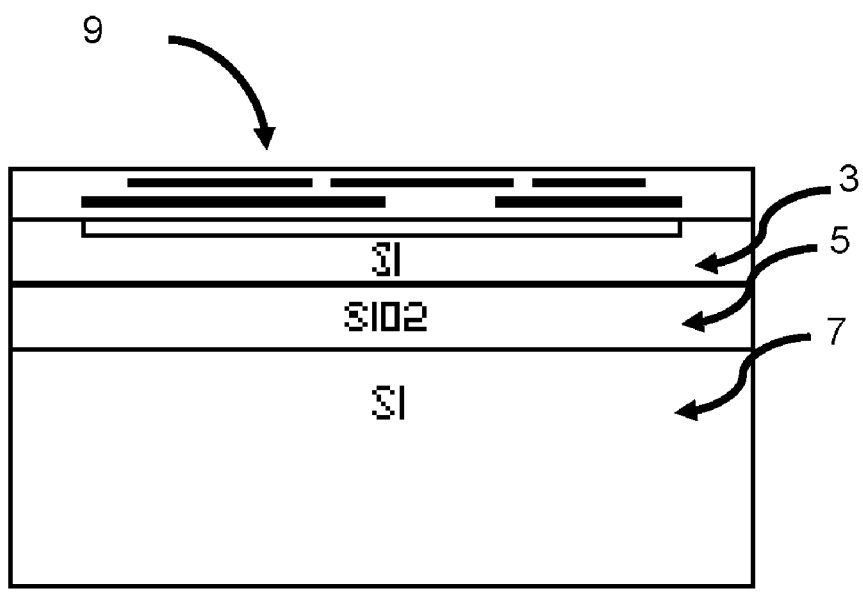
FIG. 2 is a block diagram illustrating a silicon, oxide, insulator wafer having a circuit disposed thereupon to be processed in accordance with one embodiment of the present invention.

FIG. 2 illustrates one embodiment wherein CMOS circuit 9 is formed on the wafer by conventional methods.

Figure 3:
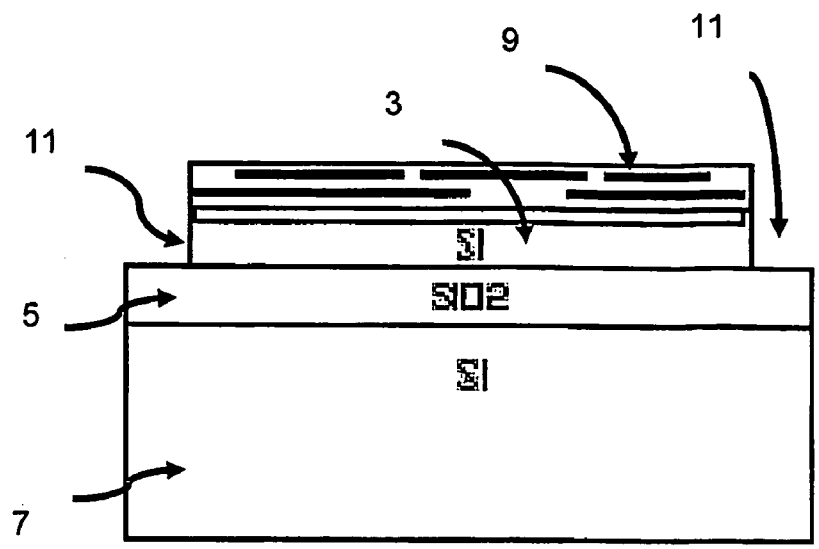
FIG. 3 is a block diagram illustrating etching to define boundaries of a die in accordance with one embodiment of the present invention.

FIG. 3 shows the step of etching through the top silicon to the dielectric insulator to form the bounds of the die. Etched trench 11 between die will vary from 1 to 5 micro-meters wide, depending on the thickness of the silicon.

Figure 4:
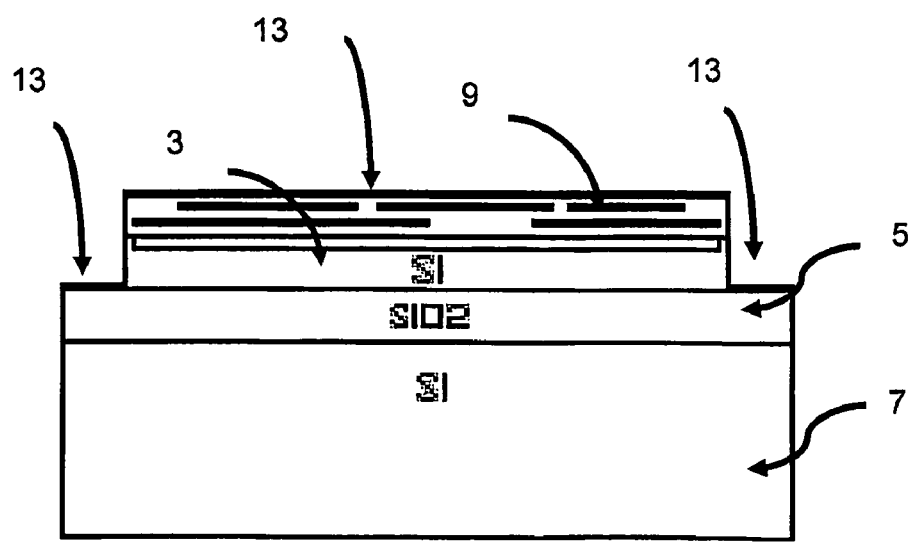
FIG. 4 is a block diagram illustrating application of $SiN_2$ to said wafer in accordance with one embodiment of the present invention.

The next step (FIG. 4) is to protect the trench by depositing layer 13 of silicon nitride 50 to 100 nano-meters thick.

Figure 5:
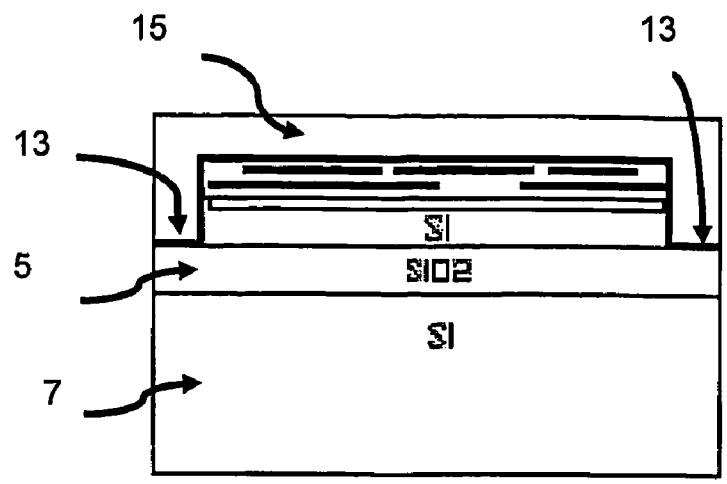
FIG. 5 is a block diagram illustrating coating of the wafer with silicon dioxide in accordance with one embodiment of the present invention.

In FIG. 5, oxide layer 15 is applied to provide a fill for the defining trenches around the die. In one embodiment, silicon oxide is employed as the oxide layer. One skilled in the art will readily appreciate that other suitable materials may be employed in the framework of the present invention.

Figure 6:
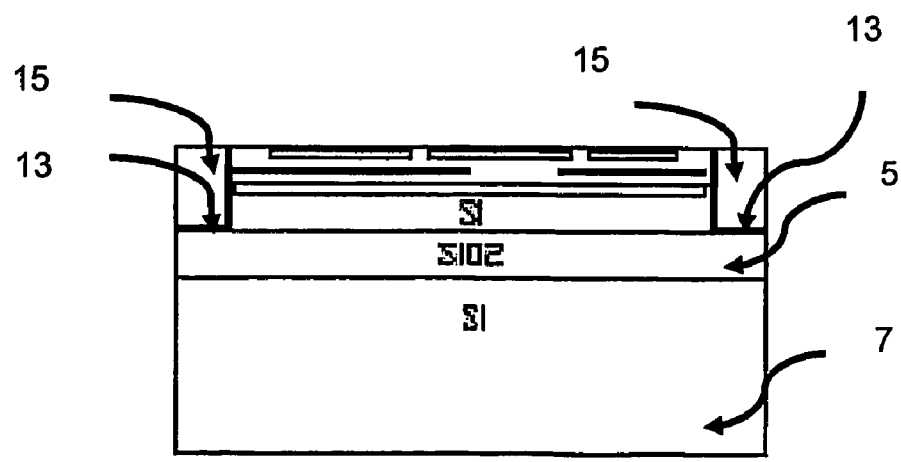
FIG. 6 is a block diagram illustrating removal of a portion of the silicon oxide layer in accordance with one embodiment of the present invention.

As illustrated in FIG. 6, oxide layer 15 then is removed by chemical mechanical planarization (CMP), retaining CMOS circuit 9 and only the part of oxide layer 15 remaining in trenches 11.

Figure 7A:
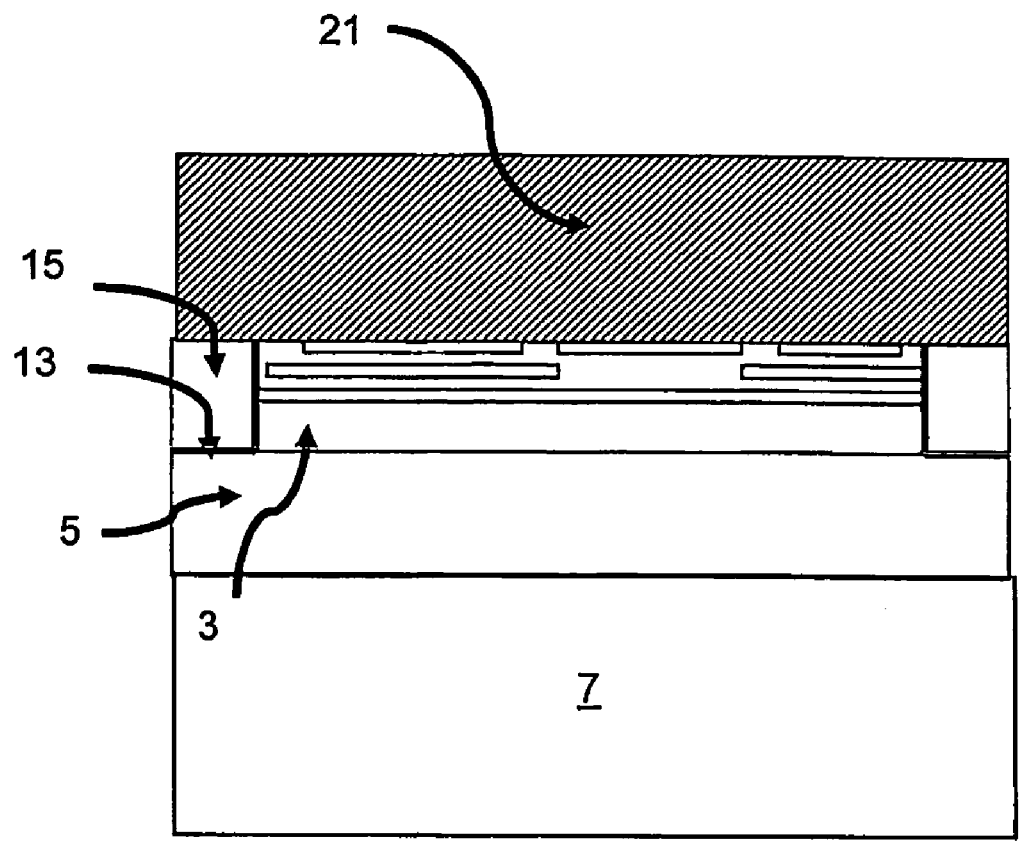
FIG. 7A is a block diagram illustrating attachment of a carrier in accordance with one embodiment of the present invention.
Figure 7B:
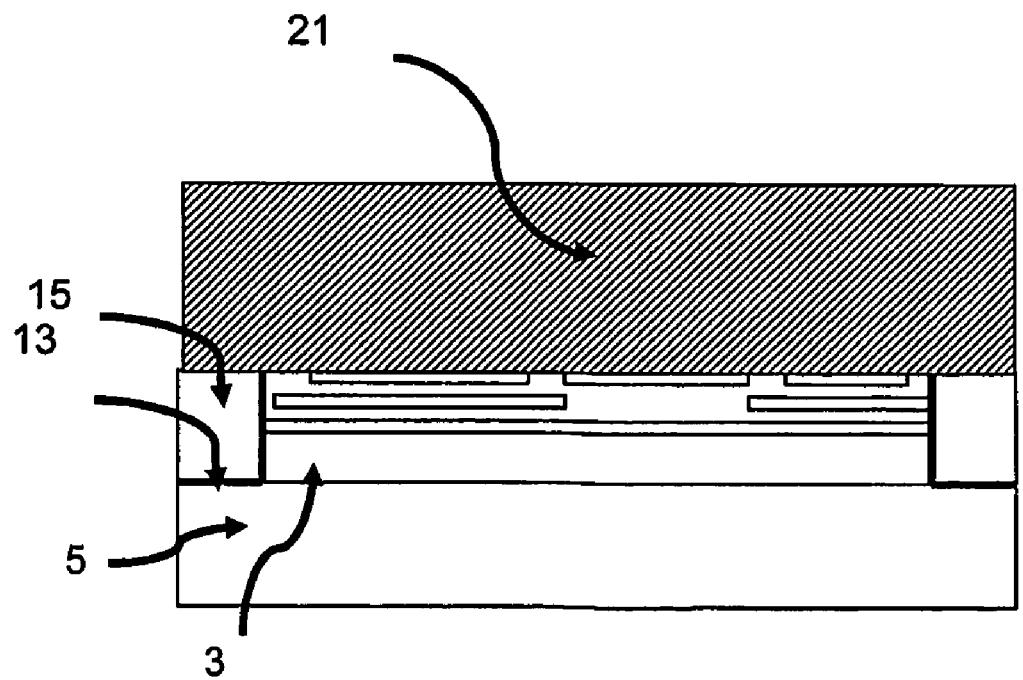
FIG. 7B is a block diagram illustrating removal of the wafer substrate in accordance with one embodiment of the present invention.
Figure 8:
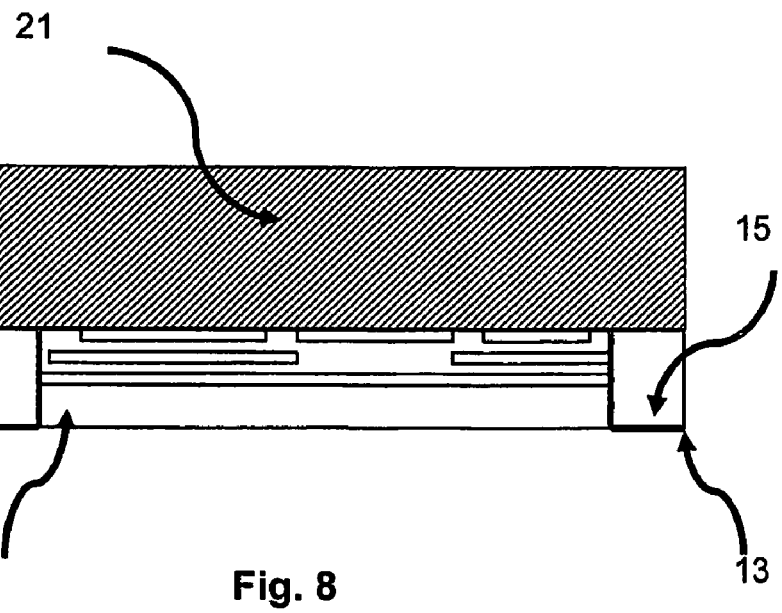
FIG. 8 is a block diagram illustrating etching of the oxide layer of the wafer in accordance with one embodiment of the present invention.

As shown in FIGS. 7A and 7B, the wafer is then mounted onto sapphire, silicon, anodized aluminum, or silicon carbide carrier 21 and the silicon substrate is removed by using a combination of back grinding and wet etching. Carrier 21 provides a support structure for the die until final separation. According to one embodiment of the present invention Next as shown in FIG. 8, the lower isolating silicon oxide 5 has been removed. Nitride layer 13 prevented removal of the silicon oxide 15 in the trenches.

Figure 9:
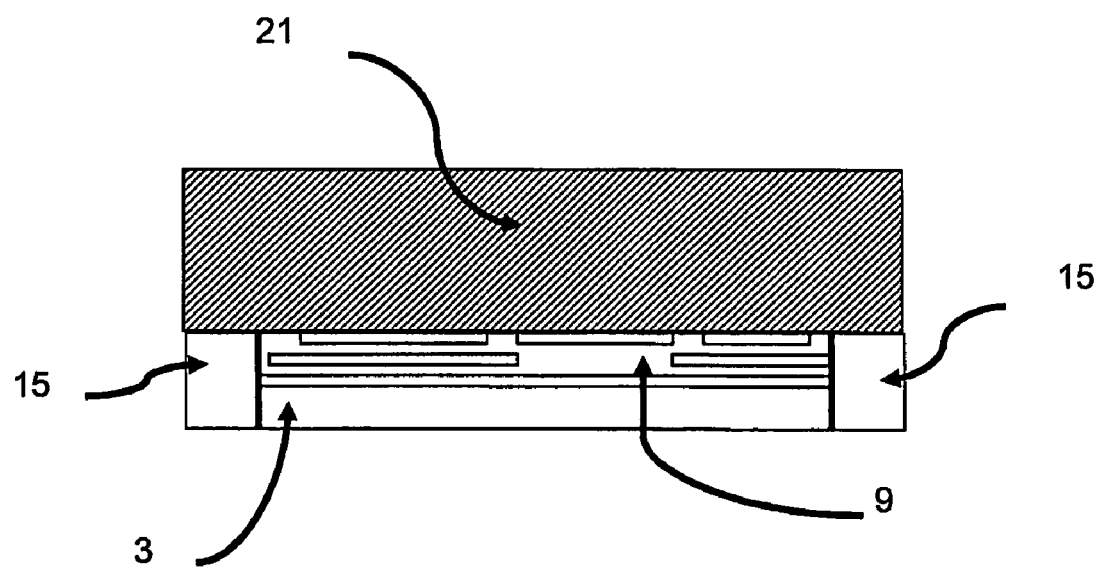
FIG. 9 is a block diagram illustrating removal of a portion of the $SiN_2$ layer of FIG. 5 in accordance with one embodiment of the present invention.

FIG. 9 shows the structure after nitride layer 13 is removed using a selective wet etch.

Figure 10:
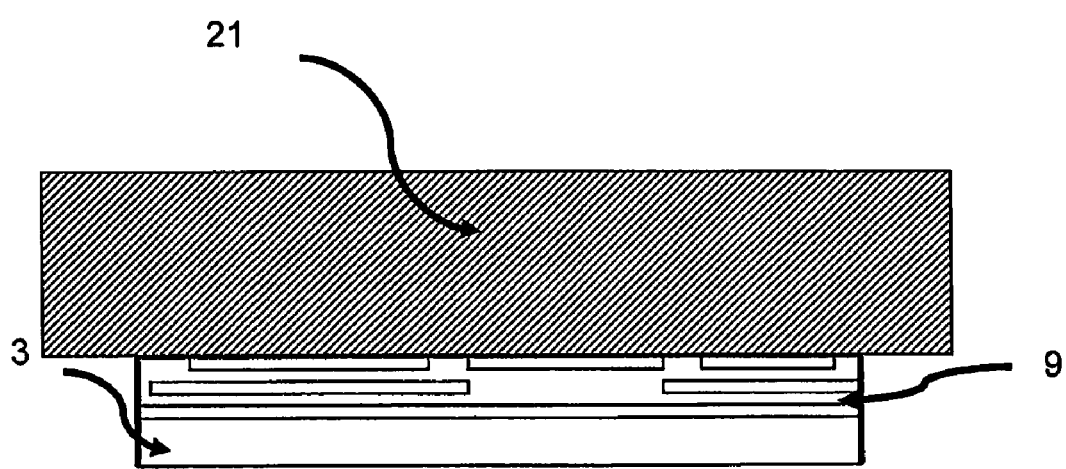
FIG. 10 is a block diagram illustrating etching to separate the die in accordance with one embodiment of the present invention.

The oxide remaining in trench area 11 is then etched resulting in FIG. 10. Plasma etching is the preferred method; however, wet etching is also usable.

Figure 11:
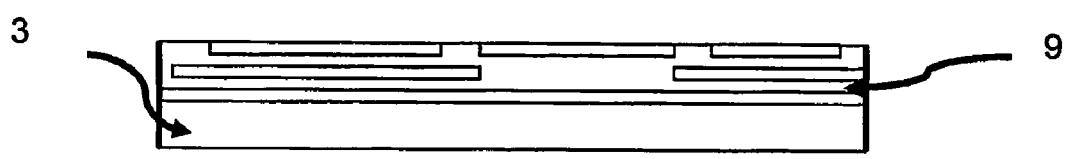
FIG. 11 is a block diagram illustrating removal of the carrier and protective photoresist in accordance with one embodiment of the present invention.

The individual dies are separated from carrier 21 using a simple solvent release as shown in FIG. 11. In one embodiment of the present invention, organic solvents may be used. Solvents used may include, but are not limited to Acetone, commercial photoresist stripper, and mixtures of $H_2SO_4$ and $H_2O_2$.

The die can be collected using filters or removed using a vacuum wand as determined by the size of the die. For micron scale die, release is followed by a series of filtered, clean solvent steps and then a bulk dry, thus providing easy handling of the microscopic size particles.

Figure 12:
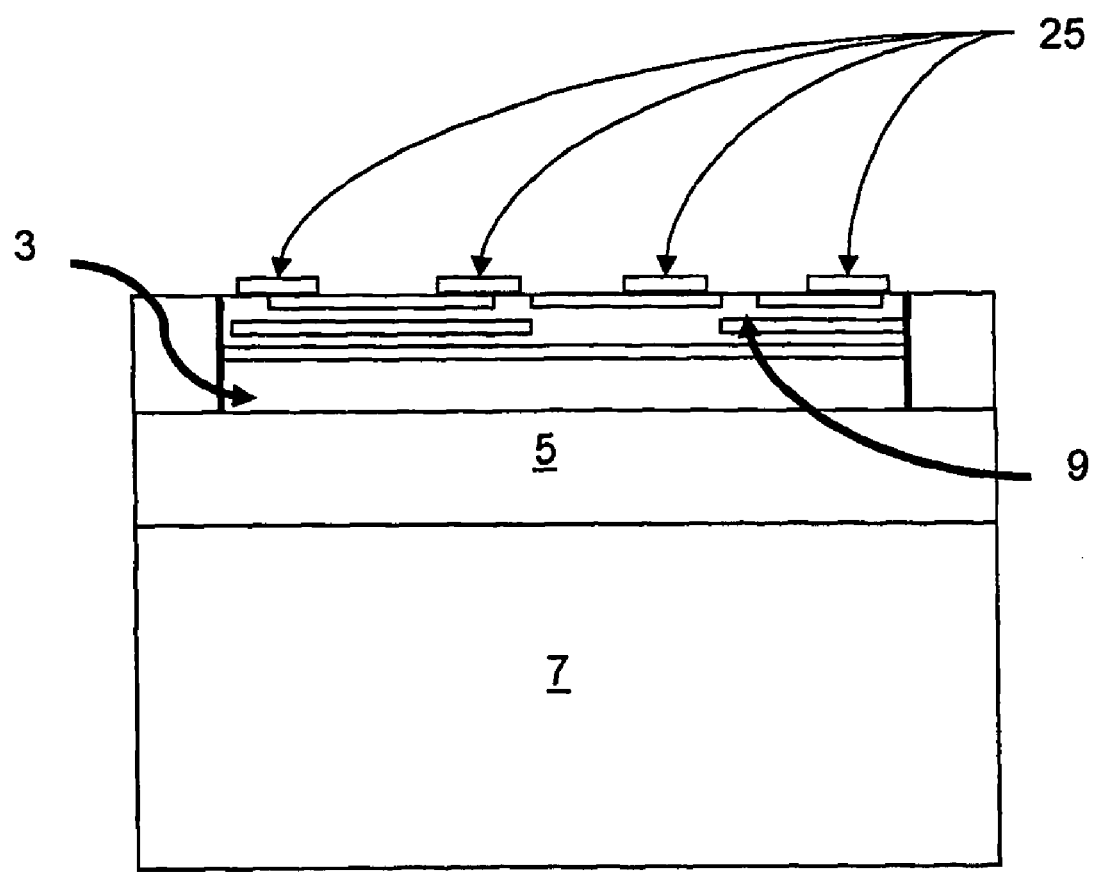
FIG. 12 is a block diagram illustrating the application of metal contacts to a wafer and die assembly of FIG. 6 in accordance with one embodiment of the present invention.

In some applications, it may be desirable to bond additional circuits onto the die. The first steps of the process are identical to FIGS. 1 through 6. Additional steps are then required in the process as shown beginning with FIG. 12, where metal pads 25 for interconnection have been applied.

Figure 13:
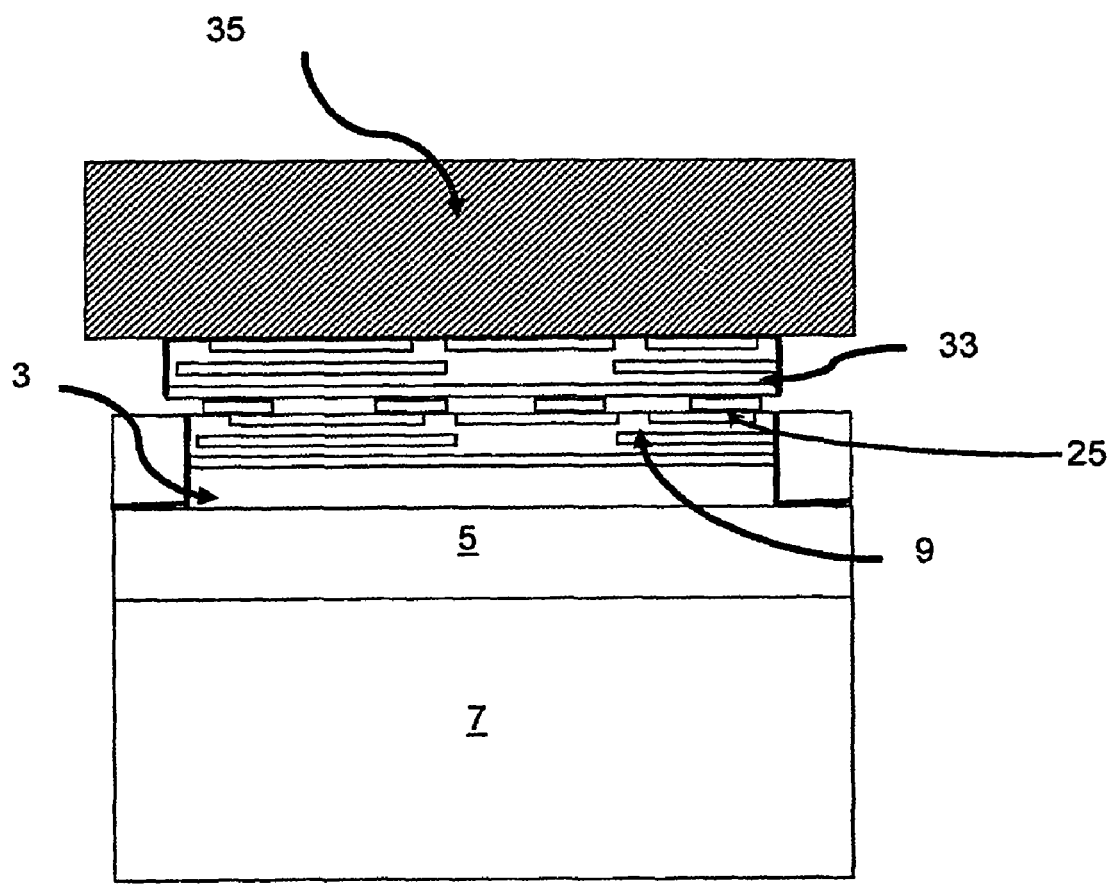
FIG. 13 is a block diagram illustrating bonding of a wafer assembly disposed on a carrier according to FIG. 10 to in accordance with one embodiment of the present invention.
Figure 14:
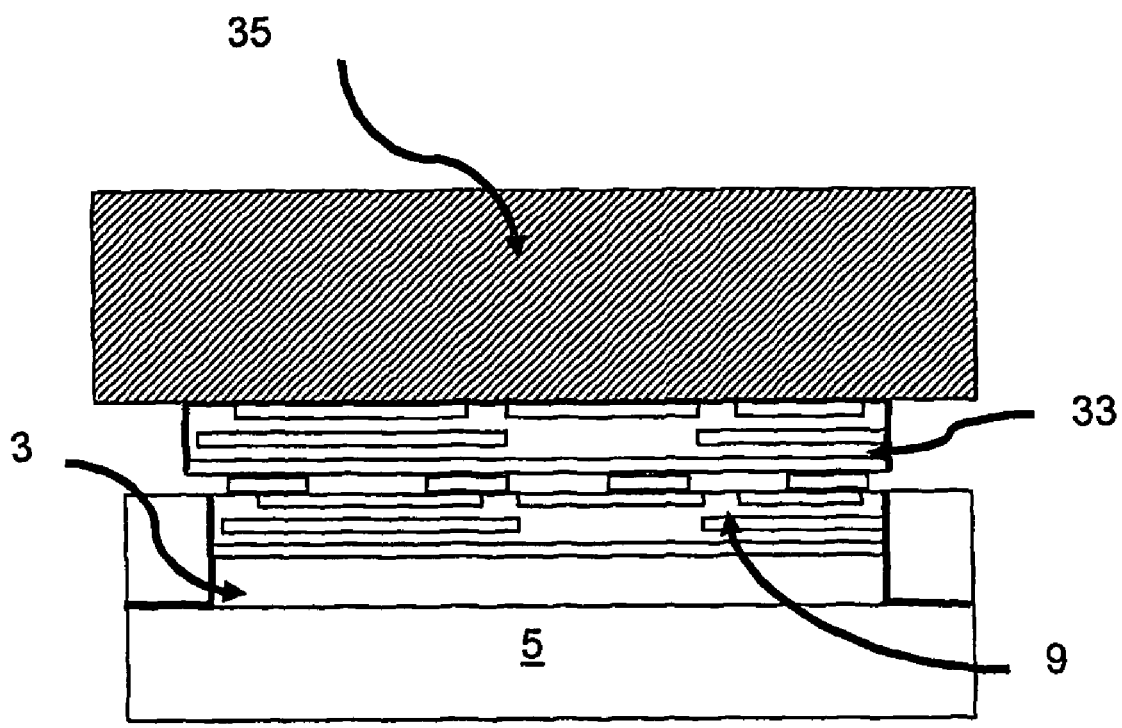
FIG. 14 is a block diagram illustrating removal of the wafer substrate in accordance with one embodiment of the present invention.
Figure 15:
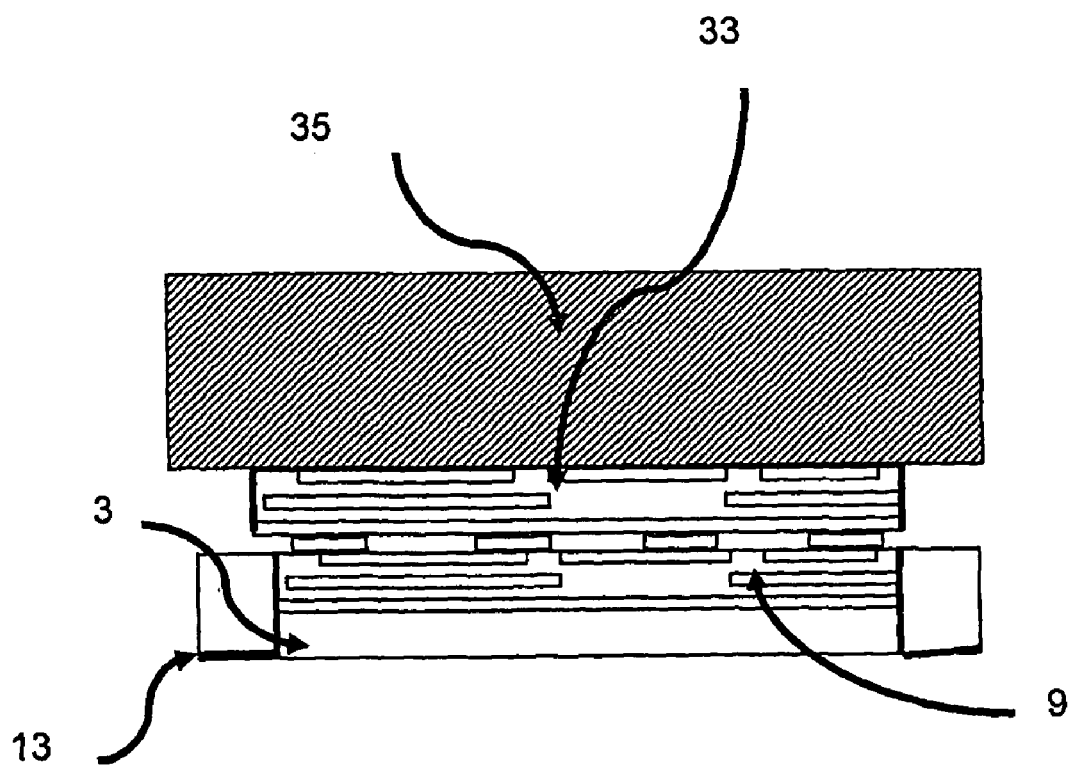
FIG. 15 is a block diagram illustrating etching of the oxide layer of the wafer in accordance with one embodiment of the present invention.
Figure 16:
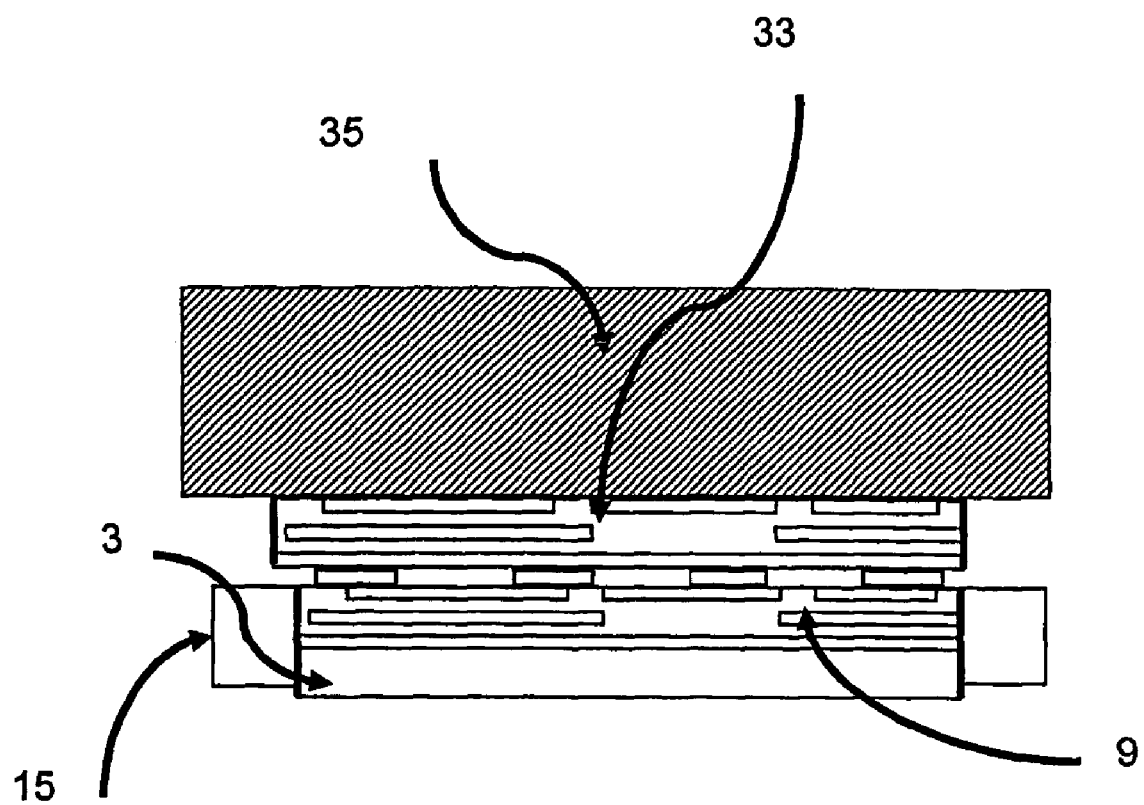
FIG. 16 is a block diagram illustrating removal of a portion of the $SiN_2$ layer of FIG. 5 in accordance with one embodiment of the present invention.
Figure 17:
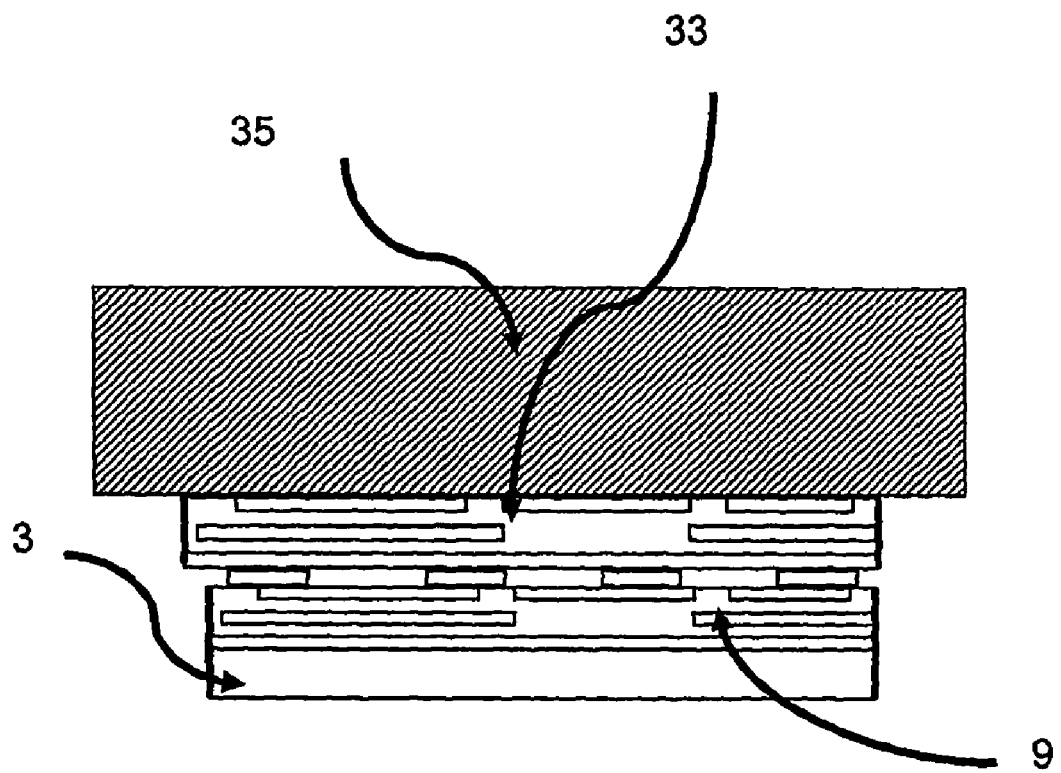
FIG. 17 is a block diagram illustrating etching to separate the die in accordance with one embodiment of the present invention.
Figure 18:
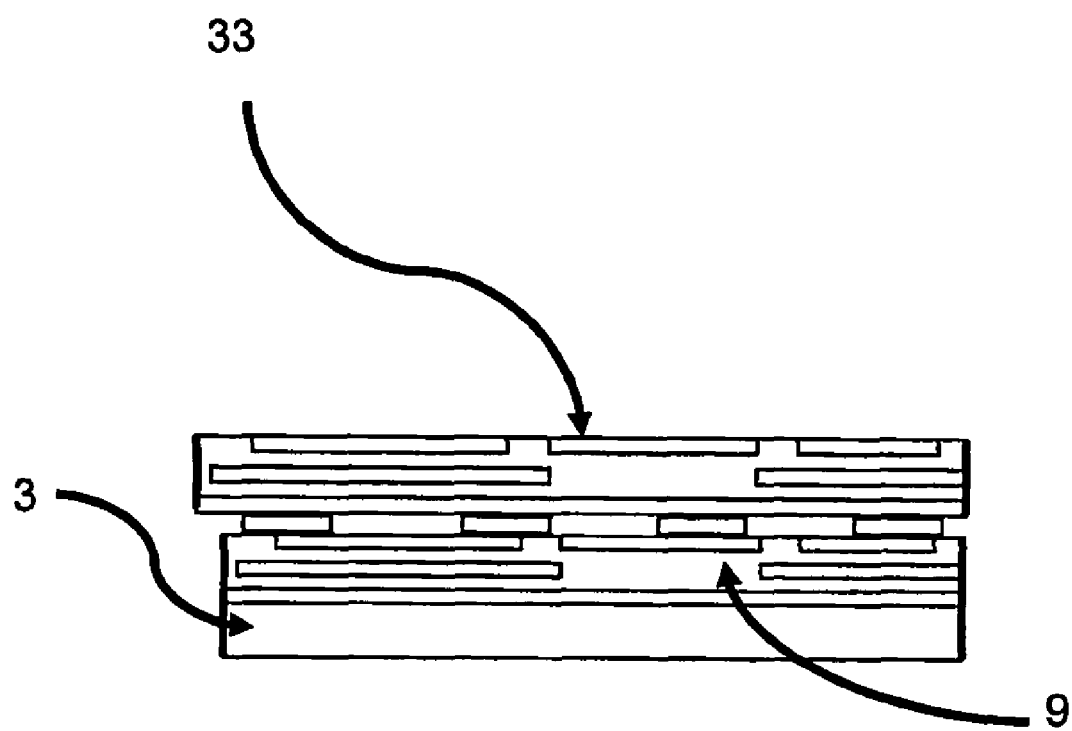
FIG. 18 is a block diagram illustrating removal of the carrier and protective photoresist in accordance with one embodiment of the present invention.

FIG. 13 shows an additional circuit layer 33 carried on substrate 35 electrically and mechanically bonded to metal pads 25.

As shown in FIGS. 14 through 18, a process identical to FIGS. 7A through 11 is used to separate the individual die.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for the singulation of integrated circuit die, said method comprising:
   Etching a semiconductor layer disposed on a silicon oxide dielectric layer, thereby forming a trench defining a boundary of said die;
   Depositing a silicon nitride layer in said trench;
   Coating said semiconductor layer with an oxide layer such that said trench is filled;
   Removing part of said oxide layer from said semiconductor layer such that said oxide layer only remains in said trench;
   Mounting said semiconductor layer with said oxide layer remaining only in said trench to a carrier;
   Removing said silicon oxide dielectric layer, said nitride layer, and said oxide layer from said semiconductor layer mounted to said carrier; and
   Releasing said die from said carrier.

2. The method according to claim 1 wherein said semiconductor layer comprises a complementary metal-oxide semiconductor circuit.

3. The method according to claim 1 wherein said oxide layer' comprises silicon oxide.

4. The method according to claim 1 wherein said removing said silicon oxide dielectric layer, said nitride layer, and said oxide layer comprises:
   Selective wet etching of said silicon nitride layer; etching said oxide layer.

5. The method according to claim 4 wherein said etching said oxide layer comprises etching by a technique of etching selected from the group of techniques consisting of wet etching and plasma etching.

6. The method according to claim 1 wherein a plurality of trenches is formed in said substrate.

7. The method according to claim 1 further comprising bonding a second circuit to said semiconductor layer.

8. The method according to claim 7 wherein said bonding comprises: applying metallic pads to said semiconductor layer; coupling said metallic pads to said second circuit.

9. The method according to claim 1 wherein said releasing of said dies from said carrier comprises a solvent release.

10. The method according to claim 1 wherein said trench is non-linear.

11. The method according to claim 1 wherein said die is of a non-standard shape.

12. A method for the manufacture of a semiconductor die, said method comprising:
   Fabricating a first semiconductor device on a wafer, said wafer being disposed on a silicon oxide dielectric layer;
   Etching said wafer, thereby forming a trench defining a boundary of said die;
   Depositing a silicon nitride layer in said trench;
   Coating said semiconductor layer with an oxide layer such that said trench is filled;
   Removing part of said oxide layer from said wafer such that said oxide layer remains only in said trench;
   Mounting said wafer having only said trench filled with oxide layer to a carrier;
   Removing said silicon oxide dielectric layer, said nitride layer, and said oxide layer from said wafer mounted to said carrier; and
   Releasing said die from said carrier.

13. The method according to claim 12, wherein said releasing said die from said carrier further comprises using solvents to release said die.

14. The method according to claim 12 wherein said step of removing said silicon oxide dielectric layer, said nitride layer, and said oxide layer, further comprises plasma etching said oxide layer.

15. The method according to claim 12 wherein said step of removing said silicon oxide dielectric layer, said nitride layer, and said oxide layer, further comprises wet etching said nitride layer.

16. The method according to claim 12 wherein said step of removing said silicon oxide dielectric layer, said nitride layer, and said oxide layer, further comprises back grinding and wet etching of said silicon oxide dielectric layer.

17. The method according to claim 12 wherein said carrier is of a carrier material selected from the group of fabric materials consisting of sapphire, silicon, anodized aluminum, and silicon carbide.

18. The method according to claim 12 wherein said trench is nonlinear.

* * * * *